United States Patent [19]

Chua et al.

[11] Patent Number: 5,789,806

[45] Date of Patent: Aug. 4, 1998

[54] LEADFRAME INCLUDING BENDABLE SUPPORT ARMS FOR DOWNSETTING A DIE ATTACH PAD

[75] Inventors: Charlie Kho Chua, San Jose; Ka-Heng The, Los Altos; Peter Howard Spalding, Cupertino, all of Calif.

[73] Assignee: National Semiconductor Corporation, Santa Clara, Calif.

[21] Appl. No.: 820,699

[22] Filed: Mar. 18, 1997

Related U.S. Application Data

[63] Continuation of Ser. No. 518,743, Aug. 2, 1995, abandoned.
[51] Int. Cl.[6] .................................................. H01L 23/495
[52] U.S. Cl. ........................... 257/676; 257/669; 257/666
[58] Field of Search ................................. 257/676, 669, 257/666

[56] References Cited

U.S. PATENT DOCUMENTS 5,394,751  3/1995  Ishibashi ................................. 257/676

FOREIGN PATENT DOCUMENTS

| 3-77356 | 4/1991 | Japan | 257/676 |
| 4-37160 | 2/1992 | Japan | 257/676 |

*Primary Examiner*—Teresa M. Arroyo
*Attorney, Agent, or Firm*—Hickman Beyer & Weaver,LLP

[57] ABSTRACT

A leadframe including bendable support arms for downsetting a die attach pad and method are disclosed herein. The leadframe includes at least one frame member and the die attach pad. At least two distinct, readily bendable support arms are connected with and extend between the die attach pad and the frame member. The support arms are configured to be bent in a predetermined way in the method of the invention such that when they are bent they provide previously unattainable amounts of die attach pad downset within the overall configuration of the leadframe.

10 Claims, 4 Drawing Sheets

5,789,806

1

LEADFRAME INCLUDING BENDABLE SUPPORT ARMS FOR DOWNSETTING A DIE ATTACH PAD

This is a continuation of application Ser. No. 08/518,743, filed Aug. 2, 1995, abandoned.

BACKGROUND OF THE INVENTION

The present invention relates generally to a leadframe and more particularly to a leadframe which includes a die attach pad which can be downset in a predetermined way relative to the remainder of the leadframe. In the manufacture of the leadframe of the present invention, a method of downsetting its die attach pad is also disclosed herein.

A leadframe for use in a semiconductor component package is typically stamped from a unitary sheet of metal and is generally comprised of (1) a die attach pad for fixedly supporting a semiconductor die, (2) an array of electrically conductive leads arranged around the die attach pad for the connection of a plurality of bonding wires between the die and the electrically conductive leads, (3) a plurality of tie bar members adjacent to and extending between the outermost ends of the leads for supporting the leads in a given plane prior to encapsulation of the leadframe as part of the overall package, and (4) die attach pad support members extending from certain ones of the tie bar members to the die attach pad so as to support the die attach pad prior to encapsulation. As will be seen in the following discussion relating to a typical prior art leadframe, it is advantageous in most applications to downset or downwardly displace the die attach pad relative to the conductive leads within the overall final configuration of the leadframe.

Referring now to FIG. 1, a prior art leadframe is generally indicated by reference numeral 10 and includes a die attach pad 12. An array of electrically conductive leads 14 are positioned around die attach pad 12 and have innermost ends 16 adjacent the pad and outermost ends 18 interconnected by a plurality of tie bar members 20. Four die attach pad support members 22 extend from tie bars 20 to die attach pad 12 so as to support the latter relative to leads 14. In the leadframe of the present example, die attach pad support members 22 are also used to provide the desired downset, as will be described in detail immediately hereinafter.

In most applications which utilize a leadframe it is desirable to downset the die attach pad relative to the conductive leads such that the ultimately provided electrical interconnections (bonding wires) between a semiconductor device or die (not shown) supported by the pad and the electrically conductive leads are kept as short as possible to minimize the possibility of damage to the bonding wires which are relatively fragile. In the past, this downsetting has typically been accomplished by downwardly displacing die attach pad 12 in a way which stretches die attach pad support members 22. Generally, the die attach pad may be downset from the plane of conductive leads 18 a lateral distance of approximately two to three times the thickness of the sheet of material from which the leadframe is formed using this method. Attempting to further downset the die attach pad can excessively stretch die attach pad support members 22 resulting in their breakage. This downsetting technique has, until now, provided an acceptable amount of die attach pad downset in leadframe applications of the prior art.

More recently, however, applications have been developed which require far more die attach pad downset than the leadframes of the prior art are capable of providing. Downsets in these new applications may be as much as, for

2 example, 5 or more times the thickness of the material from which the leadframe is formed. The present invention introduces in this application a highly advantageous leadframe structure and its associated method for providing die attach pad downsets which far exceed those previously available.

SUMMARY OF THE INVENTION

As will be described in more detail hereinafter, there is disclosed herein a leadframe for supporting a semiconductor die in a semiconductor component assembly and its associated method. This leadframe, like the leadframe illustrated in FIG. 1, includes a die attach pad for supporting a semiconductor device or die. However, in accordance with the present invention, the leadframe also includes at least one member spaced from and positioned above the die attach pad and at least two distinct, readily bendable support arms connected with and extending between the die attach pad and the member for supporting the die attach pad in a position below the member. The support arms are bent in a predetermined way so as to establish the position of the die attach pad relative to the member whereby to provide the capability to downset the die attach pad by a preselectable amount of at least 2 or more times the thickness of the actual leadframe material.

In the manufacture of an integral leadframe including a die attach pad for supporting a semiconductor device and an adjacent support member, a method of downsetting the die attach pad relative to a support member is disclosed herein. In accordance with the present invention, the support member and the die attach pad are initially maintained in a common plane by means of at least two bendable support arms integrally connected to both the pad and the member, respectively. Thereafter, the support arms are bent so as to position the die attach pad below the member whereby to downset the pad within the overall leadframe configuration by a preselectable amount.

BRIEF DESCRIPTION OF THE DRAWINGS

The present invention may be understood by reference to the following detailed description taken in conjunction with the drawings in which.

DETAILED DESCRIPTION OF THE INVENTION

Figure 1:
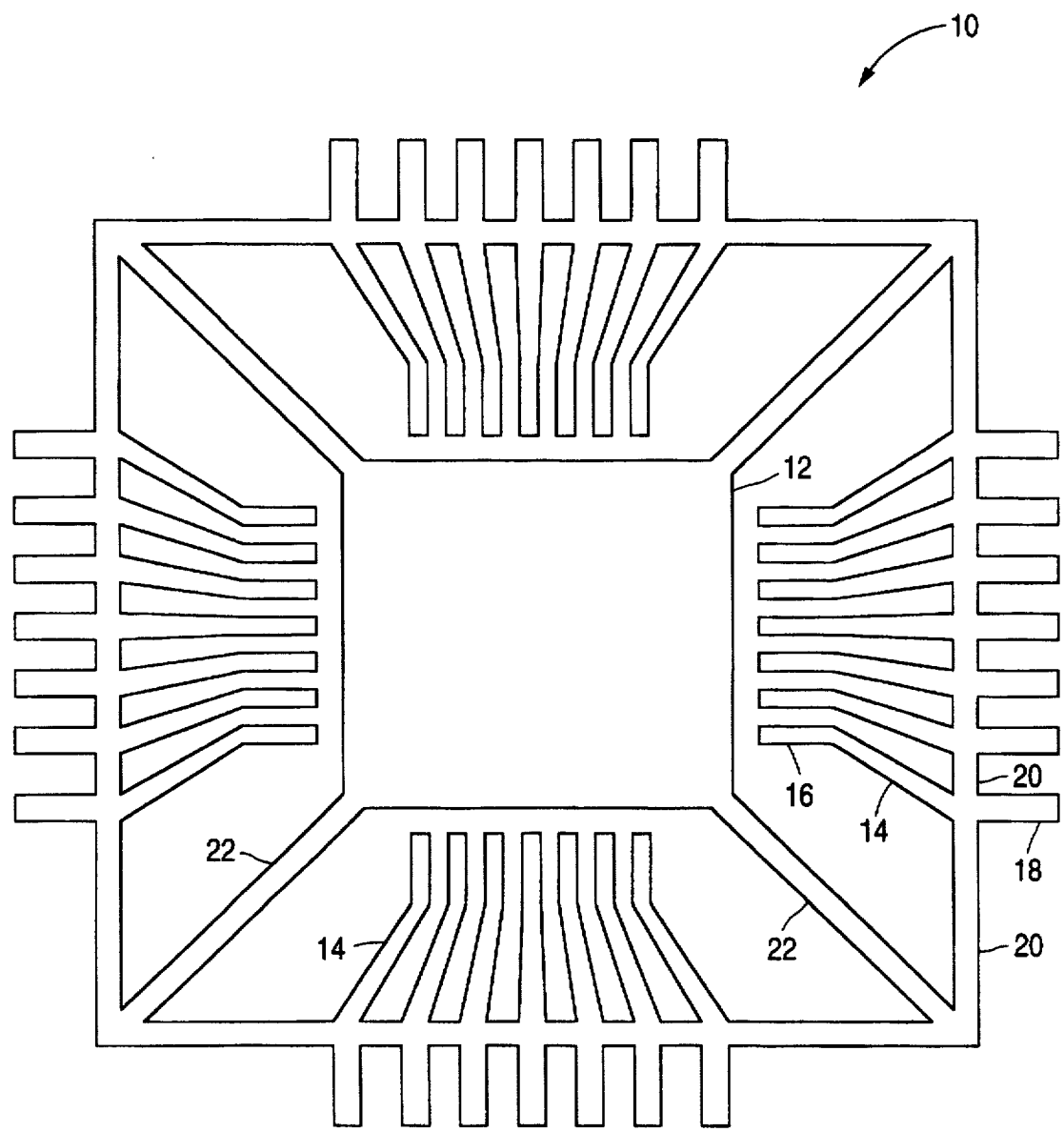
FIG. 1 is a diagrammatic enlarged plan view illustrating details of a prior art leadframe to show a previous arrangement for downsetting the die attach pad of the leadframe.
Figure 2:
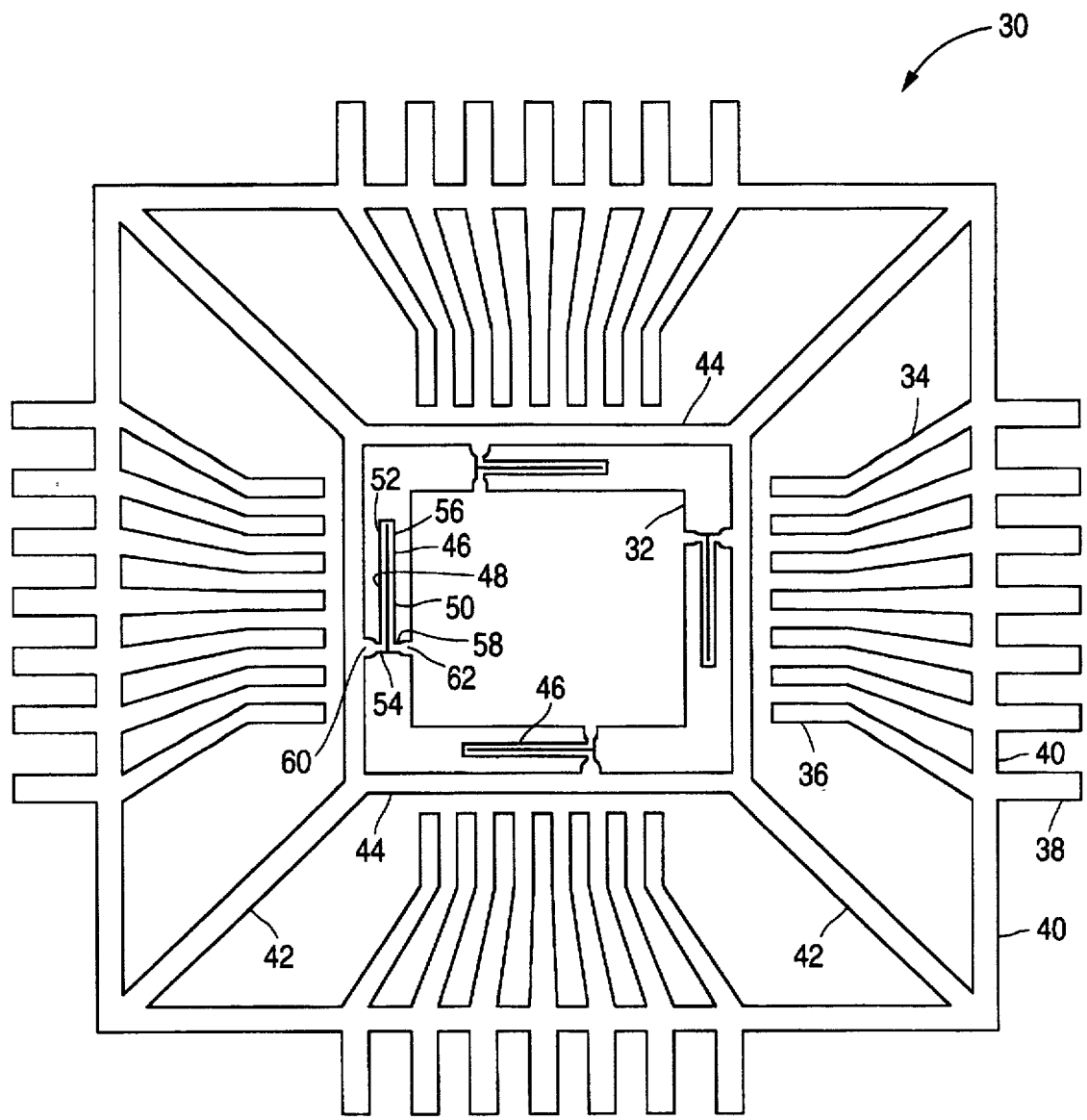
FIG. 2 is a diagrammatic enlarged plan view of a leadframe manufactured in accordance with the present invention illustrating details of an arrangement using bendable support arms for providing previously unattainable amounts of die attach pad downset.

Having described FIG. 1 previously, attention is immediately directed to FIG. 2 which illustrates a leadframe manufactured in accordance with a method of the present invention and generally indicated by reference numeral 30. Leadframe 30 includes a die attach pad 32. An array of electrically conductive leads 34 are positioned around die attach pad 32 having innermost ends 36 adjacent the pad and outermost ends 38 interconnected by a plurality of tie bar members 40. At a point after encapsulation of a component assembly in which this leadframe is used, tie bar members 40 are severed on opposite sides of leads 34 and leads 34 are thereafter electrically isolated from one another and supported fully by the encapsulant material (not shown). A plurality of die attach pad support legs 42 extend from tie bars 40 to a frame member 44 which is coplanar with leads 34 and which surrounds die attach pad 32.

Figure 3:
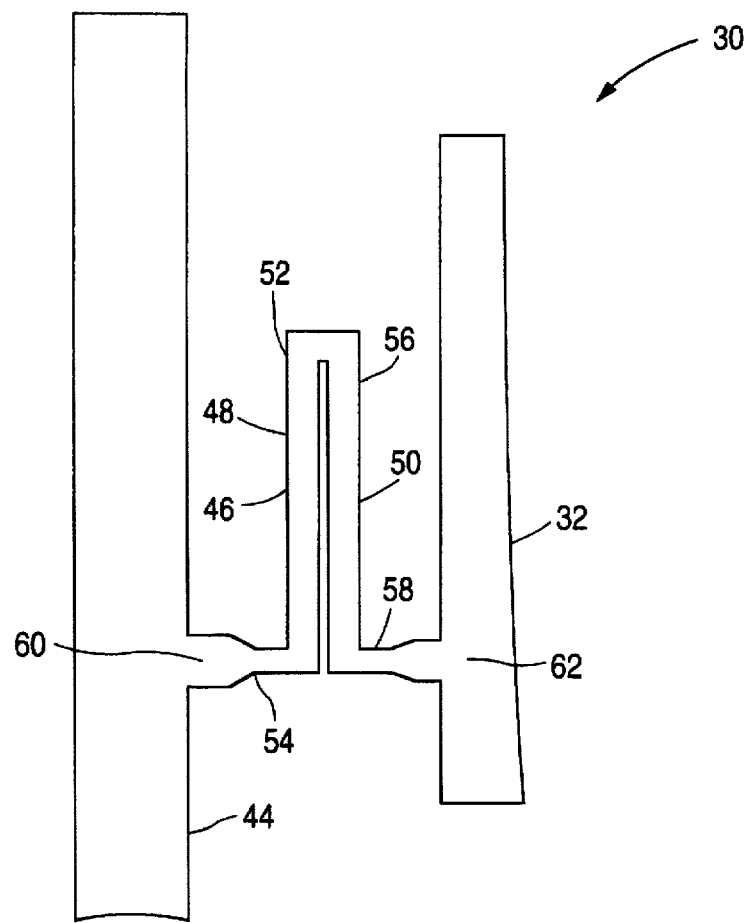
FIG. 3 is a diagrammatic enlarged fragmentary plan view of one of the bendable support arms of FIG. 2 shown here to more clearly illustrate details of its configuration in accordance with the present invention.

Referring now to FIG. 3 in conjunction with FIG. 2 and in accordance with the present invention, a plurality of support arms 46 (only one of which is illustrated in FIG. 3 for purposes of clarity) extend along a non-linear path between die attach pad 32 and frame member 44. In the present example, four support arms 46 are utilized with one positioned at each respective side of the die attach pad, although any desired number of support arms greater than one may provide sufficient support depending upon the specific geometric shape and arrangement of the die attach pad and surrounding frame member. In this preferred embodiment, each support arm 46 includes two sub-arms 48 and 50. Sub-arm 48 includes first and second ends 52 and 54, respectively, while sub-arm 50 includes first and second ends 56 and 58, respectively. First ends 52 and 56 of the sub-arms are fixedly attached to one another. Second end 54 of sub-arm 48 is fixedly attached to frame member 44 at predetermined points 60 and second end 58 of sub-arm 50 is fixedly attached to points 62 about the periphery of die attach pad 32. Attachment points 60 on the frame member and 62 on the die attach pad for each respective support arm are directly opposed to one another in this preferred embodiment, although many other configurations are acceptable within the scope of the present invention and these points need not be opposed. It should be noted that support arms 46 are generally integrally formed along with the overall leadframe, which is normally stamped from a unitary sheet of metal. Since prior art leadframes have also typically been formed by stamping, the present invention may be produced with relative ease by the same technique.

Figure 4:
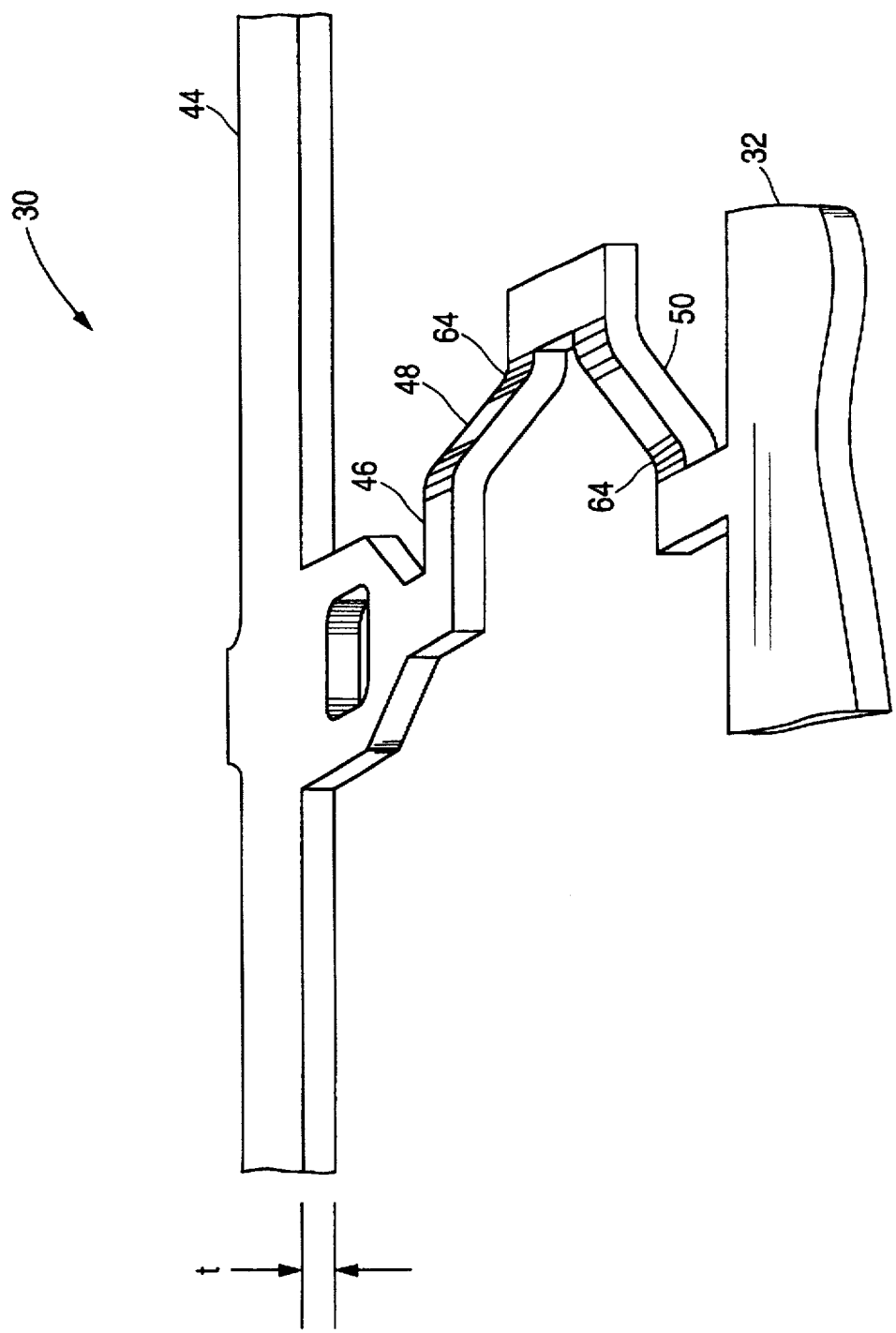
FIG. 4 is a diagrammatic enlarged fragmentary perspective view of one of the bendable support arms of FIG. 2 shown here to specifically illustrate details of its arrangement after being bent in accordance with the present invention.

Turning now to FIG. 4 one support arm 46 (all of which are similarly disposed) is illustrated after being bent in accordance with the method of the present invention. Initially, die attach pad 32, frame member 44 and support arm 46 share a common plane (see preceding figures). Thereafter, support arms 46 (only one of which is shown in the present example) are bent so as to position die attach pad downwardly below frame member 44. The support arm of the illustrated embodiment is specifically configured so as to bend in predetermined areas 64 adjacent the first and second ends of sub-arms 48 and 50 as die attach pad 32 is downset relative to frame member 44. In an alternative embodiment, the support arms may be configured to, for example, curve over substantially the entire length of the arm during bending. The die attach pad may be downset over a broad range of displacement by this method such as, for example, 0 to any number of times the thickness t of the leadframe material, as required. Actually, the amount of downset available in accordance with the present invention is not constrained by the thickness t of the leadframe material, but rather only by the configuration of support arms 46 and is, for this reason, virtually unlimited in a practical sense.

Figure 5:
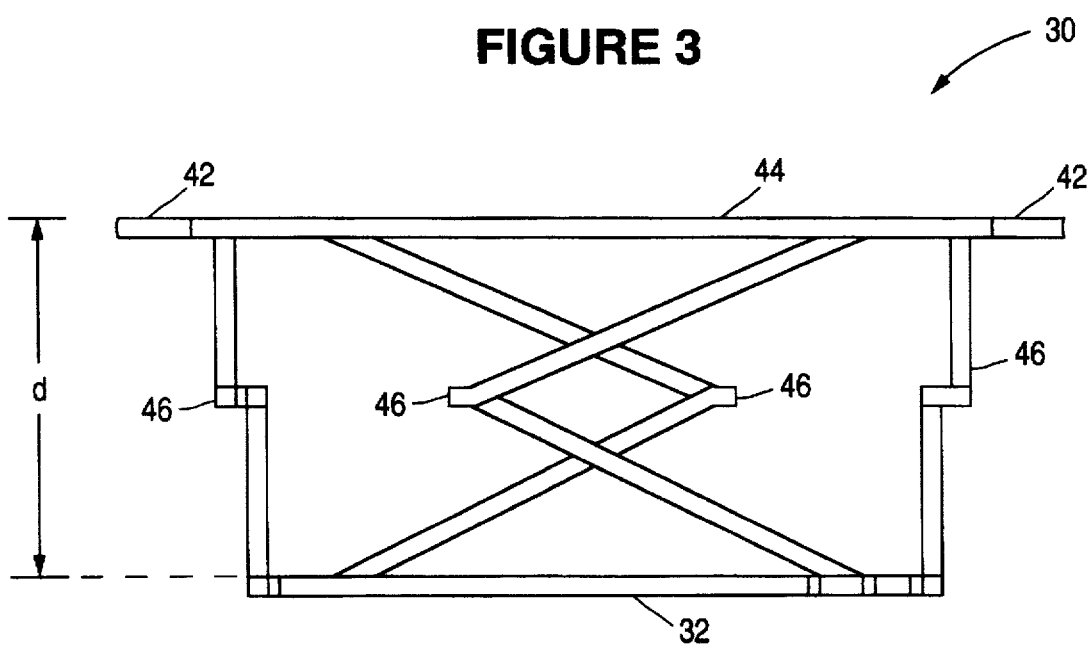
FIG. 5 is a diagrammatic enlarged fragmentary elevational view illustrating the arrangement of the die attach pad and the bendable support arms in relation to the overall leadframe following downsetting of the die attach pad by bending the support arms in accordance with the present invention.

FIG. 5 illustrates die attach pad 32 downset by distance d in relation to frame member 44 with support arms 48 in their bent configuration. It is clearly evident that the leadframe of the present invention provides a previously unavailable amount of downset d. While the amount of die attach pad downset illustrated in the present example is somewhat extreme, it is achievable with relative ease by the present invention. Materials such as, for example, copper alloys from which leadframes have typically been formed remain useful in this application. Many other materials may also be employed provided only that they are bendable and otherwise compatible as a leadframe. It is also anticipated that support arms 46 may be formed separately from the overall leadframe and connected between an independently provided die attach pad 32 and an intermediate assembly which includes a frame member as well as electrically conductive leadframe leads.

It should be understood that the leadframe and specifically configured integrally formed bendable support arms of the present invention may be embodied in many other specific forms and produced by other methods without departing from the spirit or scope of the present invention. For example, one skilled in the art may alter the support arms such that they each include more than two sub-arms (not shown) or the sub-arms may be curved (not shown) rather than straight. Therefore, the present examples are to be considered as illustrative and not restrictive, and the invention is not to be limited to the details given herein, but may be modified within the scope of the appended claims.

What is claimed is:

1. A leadframe for supporting a semiconductor die in a semiconductor component assembly, said leadframe comprising:

a) a horizontally extending die attach pad for supporting said die;

b) at least one horizontally extending frame member spaced from and positioned above said die attach pad; and c) at least two distinct, readily bendable support arms, each of which is connected with and extends between said die attach pad and an adjacent edge of said one frame member for supporting said die attach pad in a position below the frame member, each of said support arms including one or more sub-arms, each sub-arm of which lies within a vertical plane extending parallel with the adjacent edge of the frame member to which its support arm is connected, said support arms being bent in a predetermined way such that each sub-arm remains in its vertical plane and so as to establish the position of said die attach pad relative to said one frame member.

2. A leadframe in accordance with claim 1 wherein each said support arm includes at least two sub-arms, each having first and second ends and defining a length therebetween, said first ends being fixedly attached to one another, said second end of one sub-arm being fixedly attached to an edge of the die attach pad and said second end of the other sub-arm being fixedly attached to said one frame member such that each of the sub-arms lies within a vertical plane extending parallel with the adjacent edge of the frame member to which its support arm is connected.

3. A leadframe in accordance with claim 2 wherein said second ends of said sub-arms are fixedly attached to directly opposing portions of the die attach pad and said frame member, respectively.

4. A leadframe in accordance with claim 3 wherein said sub-arms define a non-linear path extending between said directly opposing portions of said die attach pad and said frame member, said sub-arms being cooperatively bent in predetermined areas so as to establish said position of the die attach pad.

5. A leadframe in accordance with claim 4 wherein said sub-arms are bent primarily in areas adjacent their ends.

6. A leadframe in accordance with claim 1 wherein said leadframe including said support arms is stamped from a unitary sheet of metal having a predetermined thickness.

7. A leadframe in accordance with claim 6 wherein said one frame member is positioned above said die attach pad at a distance that is at least two times greater than said thickness.

8. In the manufacture of an integral leadframe including a die attach pad for supporting a semiconductor device and an adjacent frame member, a method of downsetting said die attach pad relative to the frame member, said method comprising the steps of:

a) initially maintaining said frame member and said die attach pad in a common horizontal plane by means of at least two bendable support arms integrally connected to both the pad and an adjacent edge of the frame member, respectively, each of said support arms including one or more sub-arms, each sub-arm of which lies within a vertical plane extending parallel with the adjacent edge of the frame member to which its support arm is connected; and b) thereafter, bending said support arms such that each sub-arm remains in its vertical plane and so as to position the die attach pad below said frame member whereby the pad is downset within the overall leadframe.

9. A method according to claim 8 wherein the leadframe is formed from a unitary sheet of metal having a predetermined thickness and said step of bending displaces said die attach pad a distance below said frame member of at least two times said thickness.

10. A method according to claim 8 wherein said step for maintaining said frame member and said die attach pad in said common plane includes the step of forming each said support arm using at least two sub-arms each having first and second ends and defining a length therebetween, said first ends being fixedly attached to one another, said second end of one sub-arm being fixedly attached to an edge of the die attach pad and said second end of the other sub-arm being fixedly attached to said one frame member such that each of the sub-arms lies within a vertical plane extending parallel with the adjacent edge of the frame member to which its support arm is connected.

* * * * *